(12) United States Patent
Wang

(10) Patent No.: US 11,676,947 B2
(45) Date of Patent: Jun. 13, 2023

(54) DRIVING SUBSTRATE, METHOD FOR PREPARING THE SAME, AND DISPLAY DEVICE

(71) Applicant: BOE TECHNOLOGY GROUP CO., LTD., Beijing (CN)

(72) Inventor: Jianguo Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 181 days.

(21) Appl. No.: 16/965,470

(22) PCT Filed: Oct. 24, 2019

(86) PCT No.: PCT/CN2019/113006
§ 371 (c)(1),
(2) Date: Jul. 28, 2020

(87) PCT Pub. No.: WO2021/077354
PCT Pub. Date: Apr. 29, 2021

(65) Prior Publication Data
US 2021/0143134 A1    May 13, 2021

(51) Int. Cl.
*H01L 25/075* (2006.01)
*H01L 21/48* (2006.01)
(Continued)

(52) U.S. Cl.
CPC ...... *H01L 25/0753* (2013.01); *H01L 21/4857* (2013.01); *H01L 23/15* (2013.01);
(Continued)

(58) Field of Classification Search
CPC .......... H01L 21/4857; H01L 23/49822; H01L 25/0753
See application file for complete search history.

(56) References Cited

U.S. PATENT DOCUMENTS

2010/0188720 A1    7/2010    Nakamura et al.
2016/0308101 A1    10/2016   Konishi et al.
(Continued)

FOREIGN PATENT DOCUMENTS

CN    101789206 A    7/2010
CN    208014703 U    10/2018
(Continued)

OTHER PUBLICATIONS

Extended European Search Report of EP Application No. 19945412.5 dated Sep. 29, 2022, 9 pages.

*Primary Examiner* — Antonio B Crite
(74) *Attorney, Agent, or Firm* — Muncy, Geissler, Olds & Lowe, P.C.

(57) ABSTRACT

The present disclosure provides a driving substrate, a method for preparing the same, and a flexible display device. The driving substrate includes: a base substrate; a stress buffer layer located on the base substrate; a wiring structure located on a surface of the stress buffer layer away from the base substrate, a thickness of a wiring of the wiring structure in contact with the stress buffer layer being greater than a threshold; a first insulating layer located on a surface of the wiring structure away from the base substrate; a plurality of electronic components on a surface of the first insulating layer away from the base substrate; the electronic component being connected to the wiring structure through a via hole penetrating the first insulating layer.

20 Claims, 4 Drawing Sheets

(51) Int. Cl.
*H01L 23/15* (2006.01)
*H01L 23/498* (2006.01)
*H01L 33/60* (2010.01)
*H01L 33/62* (2010.01)

(52) U.S. Cl.
CPC .. *H01L 23/49822* (2013.01); *H01L 23/49866* (2013.01); *H01L 33/60* (2013.01)

(56) References Cited

U.S. PATENT DOCUMENTS

| | | |
|---|---|---|
| 2017/0213803 A1 | 7/2017 | Bower |
| 2018/0175106 A1 | 6/2018 | Kim et al. |
| 2020/0035147 A1 | 1/2020 | Ban et al. |
| 2021/0223631 A1 | 7/2021 | Ban et al. |
| 2022/0123026 A1* | 4/2022 | Oh ..................... H01L 27/124 |

FOREIGN PATENT DOCUMENTS

| | | | | |
|---|---|---|---|---|
| CN | 109031779 A | | 12/2018 | |
| CN | 109597245 A | * | 4/2019 | ....... G02F 1/133603 |

* cited by examiner

DRIVING SUBSTRATE, METHOD FOR PREPARING THE SAME, AND DISPLAY DEVICE

CROSS REFERENCE TO RELATED APPLICATION

The present application is the U.S. national phase of PCT Application No. PCT/CN2019/113006 filed on Oct. 24, 2019, which is incorporated herein by reference in its entirety.

TECHNICAL FIELD

The present disclosure relates to the field of display technology, in particular to a driving substrate, a method for preparing the same, and a display device.

BACKGROUND

LEDs are generally used as light sources for display panels.

SUMMARY

Embodiments of the present disclosure provide a driving substrate, a method for preparing the same, and a display device, which can achieve a large-sized driving substrate.

To solve the above technical problems, the embodiments of the present disclosure provide technical solutions as follows.

In one aspect, a driving substrate is provided, including: a base substrate; a stress buffer layer located on the base substrate; a wiring structure located on a surface of the stress buffer layer away from the base substrate, a thickness of a wiring in the wiring structure in contact with the stress buffer layer being greater than a threshold; a first insulating layer located on a surface of the wiring structure away from the base substrate; and a plurality of electronic components located on a surface of the first insulating layer away from the base substrate, the electronic components being connected to the wiring structure through a via hole penetrating the first insulating layer.

In some embodiments, the wiring structure includes at least two wiring layers, each wiring layer including a plurality of wirings and a second insulating layer is located between adjacent wiring layers, so that in a direction away from the base substrate, each wiring of a current layer is connected to at least one wiring of a next layer, and each wiring of the last layer is connected to at least one electronic component.

In some embodiments, the wiring structure includes a first wiring layer and a second wiring layer, the first wiring layer includes a plurality of first wirings that is insulated from each other, the second wiring layer includes a plurality of second wirings that is insulated from each other, each of the plurality of first wirings is connected to at least one of the plurality of second wirings through a via hole penetrating through the second insulating layer, and each of the plurality of second wirings is connected to at least one electronic component through the via hole penetrating the first insulating layer.

In some embodiments, the second wiring layer includes a plurality of groups of second wirings that are arranged in an array, and the plurality of groups of second wirings is distributed substantially along a square ring shape. In some embodiments, the first wiring and/or the second wiring include a copper layer.

In some embodiments, the first wiring further includes a first metal layer located on a surface of the copper layer proximate to the base substrate, and an adhesive force between the first metal layer and the stress buffer layer is greater than an adhesive force between the copper layer and the stress buffer layer; and/or the second wiring further includes a second metal layer located on a surface of the copper layer proximate to the base substrate, and an adhesion between the second metal layer and the second insulating layer is greater than an adhesion between the copper layer and the second insulating layer.

In some embodiments, the first metal layer and the second metal layer are made of at least one of Mo, MoNb, MoTi, MoWu, MoNi, or MoNiTi.

In some embodiments, a thickness of the first metal layer is in a range from 5 nm to 50 nm, a thickness of the second metal layer is in a range from 5 nm to 50 nm, and a thickness of the copper layer is in a range from 1 μm to 30 μm.

In some embodiments, the first wiring further includes a first conductive protective layer located on a surface of the copper layer away from the base substrate; and/or the second wiring further includes a second conductive protection layer located on a surface of the copper layer away from the base substrate.

In some embodiments, the first conductive protection layer and the second conductive protection layer are made of at least one of Mo, MoNb, MoTi, MoWu, MoNi, or MoNiTi.

In some embodiments, a thickness of the first conductive protective layer is in a range from 5 nm to 50 nm, and a thickness of the second conductive protective layer is in a range from 5 nm to 50 nm.

In some embodiments, the stress buffer layer is made of at least one of SiN, SiO, or SiON.

In some embodiments, the driving substrate further includes: an alloy composed of NiAu and Sn located on a surface of the second wiring away from the base substrate, and the electronic component is connected to the second wiring through the alloy.

In some embodiments, the driving substrate further includes: a reflective pattern located on the surface of the first insulating layer away from the base substrate, and an orthogonal projection of the reflective pattern on the base substrate at least does not partially overlap an orthogonal projection of the electronic component on the base substrate.

In some embodiments, the base substrate is a glass substrate or a quartz substrate.

In some embodiments, the electronic component is an LED.

In some embodiments, the driving substrate includes a display area and a binding area located around the display area, the via hole penetrating the second insulating layer includes a first via hole located in the display area and a second via hole located in the binding area, and a diameter of the first via hole is less than a diameter of the second via hole.

In some embodiments, the threshold is 1 μm.

An embodiment of the present disclosure further provides a driving device including the display substrate as described above.

An embodiment of the present disclosure further provides a method for preparing a driving substrate, including: providing a base substrate; forming a stress buffer layer on the base substrate; forming at least one conductive layer on the stress buffer layer, a stress direction of the conductive layer being opposite to a stress direction of the stress buffer layer, and forming a wiring structure by using the at least one conductive layer, a thickness of the conductive layer in contact with the stress buffer layer being greater than a threshold; forming a first insulating layer covering the wiring structure; and binding a plurality of electronic components on the first insulating layer, the electronic component being connected to the wiring structure through a via hole penetrating the first insulating layer.

In some embodiments, the threshold is 1 μm.

In some embodiments, the forming at least one conductive layer includes: forming a plurality of conductive sub-layers, the conductive layer being formed by stacking the plurality of conductive sub-layers.

DETAILED DESCRIPTION

Figure 1:
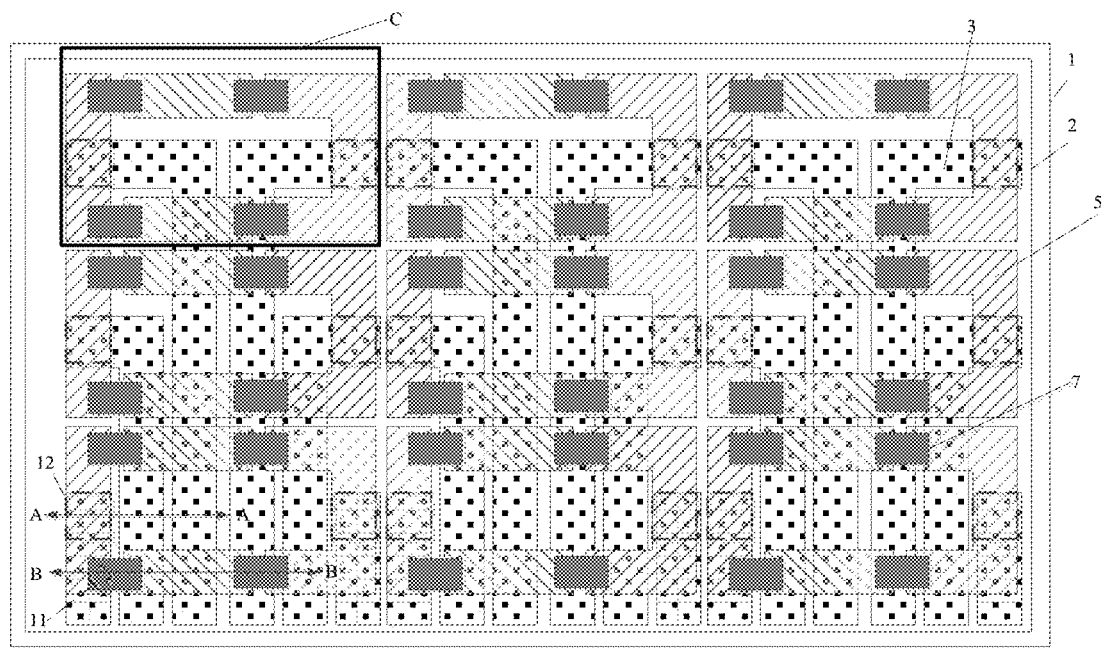
FIG. 1 is a schematic plan view showing the driving substrate according to an embodiment of the present disclosure.

In order to make the technical problems to be solved, the technical solutions, and the advantages of the embodiments of the present disclosure clearer, the present disclosure will be described hereinafter in conjunction with the drawings and specific examples.

High-dynamic range (HDR) technology can significantly enhance the contrast and viewing experience of a liquid crystal display, present perfect high contrast and excellent color expression required by HDR. A surface light source of a light emitting diode (LED) controlled by zones can realize HDR technology, which greatly improves the display effect. Due to the large current load of the surface light source of the LED, Cu having a thickness of 1 to 6 μm is required to be used to make the wirings of LED substrate. In the related art, the LED is bound to the printed circuit board, and a flexible printed circuit (FPC) provides electrical signals to it through signal lines on the printed circuit board. The printed circuit boards are usually of small size due to cost constraints. If a large-size LED surface light source is required, it needs to be spliced from small-sized printed circuit boards. However, a binding position for flexible printed circuit (FPC) need to be left at the splicing position of adjacent printed circuit boards, which will cause the frame of the LED surface light source to be very wide (usually at the centimeter level), thereby affecting the resolution and display effect of the display product.

The inventor found that in order to make a non-spliced large-sized surface light source and reduce production costs, it may be considered to prepare the signal circuit driving the LED on the glass substrate. However, the texture of the glass substrate is relatively fragile. The stress generated when a thick copper layer is formed on the glass substrate may cause the glass substrate to be broken.

In view of the above problems, embodiments of the present disclosure provide a driving substrate, a method for preparing the same, and a display device, which can achieve a large-sized driving substrate.

An embodiment of the present disclosure provides a driving substrate, including: a base substrate; a stress buffer layer located on the base substrate, a thickness of a wiring of the wiring structure in contact with the stress buffer layer being greater than a threshold; a wiring structure located on a surface of the stress buffer layer away from the base substrate; a first insulating layer located on a surface of the wiring structure away from the base substrate; and a plurality of electronic components located on a surface of the first insulating layer away from the base substrate, the electronic components being connected to the wiring structure through a via hole penetrating the first insulating layer.

In this embodiment, a stress buffer layer is arranged on the base substrate, and the stress buffer layer can relieve the stress generated when the conductive layer is formed on the base substrate, so that the base substrate will not be broken. In this way, a relatively thick conductive layer may be formed on the base substrate, and the wiring prepared by using the relatively thick conductive layer can meet the resistivity requirements of the driving substrate for the wiring, thereby driving electronic components provided on the base substrate to achieve a large-scale driving substrate and to improve the resolution and display effect of the display product. Specifically, the above threshold may be 1 μm.

The base substrate may be a glass substrate or a quartz substrate. The size of the base substrate can reach 3 m*3 m or more, so that the technical solution of the present disclosure can realize mass production of a large-sized driving substrate. Among them, the electronic component may be an LED having a size in the micrometer range, that is, the technical solution of the present disclosure can achieve a large-sized LED substrate.

In order to increase the density of the electronic components on the driving substrate, the wiring structure may include at least two wiring layers, each wiring layer including a plurality of wirings and a second insulating layer is located between adjacent wiring layers, so that in a direction away from the base substrate, each wiring of a current layer is connected to at least one wiring of a next layer, and each wiring of the last layer is connected to at least one electronic component.

In a specific embodiment, the wiring structure may include a first wiring layer and a second wiring layer, the first wiring layer includes a plurality of first wirings that is insulated from each other, the second wiring layer includes a plurality of second wirings that is insulated from each other, each of the plurality of first wirings is connected to at least one of the plurality of second wirings through a via hole penetrating through the second insulating layer, and each of the plurality of the second wirings is connected to at least one electronic component through a via hole penetrating the first insulating layer.

Of course, the wiring structure is not limited to include two wiring layers, and may also include more wiring layers. The more wiring layers of the wiring structure, the greater the density of electronic components that can be arranged.

Figure 2:
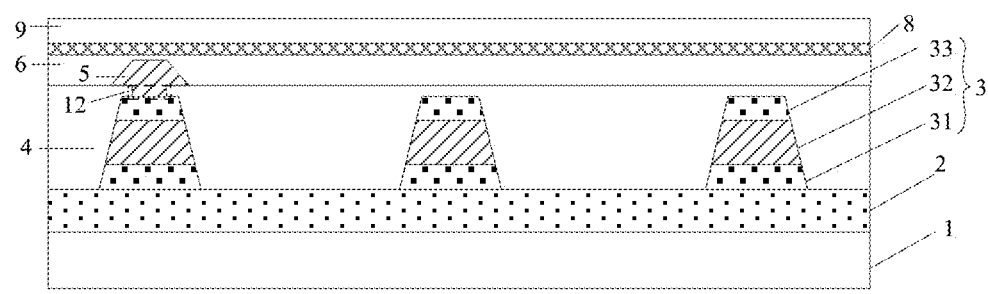
FIG. 2 is a schematic view showing the cross section in the direction of A-A of FIG. 1 according to an embodiment of the present disclosure.
Figure 3:
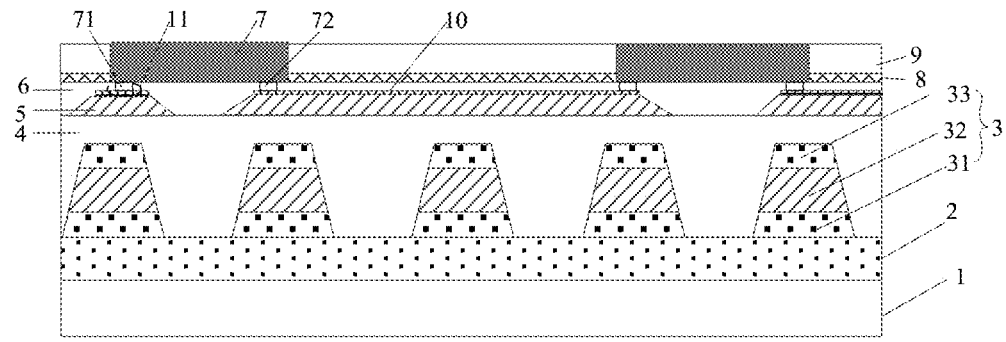
FIG. 3 is a schematic view showing an cross section in the direction of B-B of FIG. 1 according to an embodiment of the present disclosure.

FIG. 1 is a schematic plan view showing the driving substrate according to an embodiment of the present disclosure, FIG. 2 is a schematic view showing the cross section in the direction A-A of FIG. 1, and FIG. 3 is a schematic view showing the cross section in the direction B-B of FIG. 1. As shown in FIGS. 1 to 3, in a specific embodiment, taking the electronic component as LED as an example, the driving substrate includes: a base substrate 1; a stress buffer layer 2 located on the base substrate 1; a first wiring 3 located on the stress buffer layer 2; a second insulating layer 4 covering the first wiring 3; a second wiring 5 located on the second insulating layer 4; a first insulating layer 6 covering the second wiring 5; and an LED 7 located on the first insulating layer 6 and connected to the second wiring 5 through the via hole 11 penetrating the first insulating layer 6, in which the position shown by the dotted circle in FIGS. 1 and 3 is the position of the via hole 11. Among them, each first wiring 3 is connected to a plurality of second wirings 5, and the first wiring 3 is connected to the second wiring 5 through the via hole 12 located in the second insulating layer 4, in which as shown in FIGS. 1 and 2, the position shown by the dotted box is the position of the via hole 12. The second wiring 5 is connected to a plurality of LEDs 7 and functions to connect adjacent LEDs 7. As shown in FIG. 3, each LED 7 includes an N pad 71 and a P pad 72. The N pad 71 and the P pad 72 of the LED 7 are connected to the second wirings 5 located at different positions through the via hole 11 penetrating the first insulating layer 6, respectively.

Specifically, as shown in FIG. 1, the second wirings 5 are divided into a plurality of groups arranged in an array. In some embodiments, each group of second wirings 5 is connected to four LEDs 7, and each group of second wirings 5 can be distributed substantially along a square ring shape. Of course, each group of second wirings 5 is not limited to forming a ring shape, and other shapes are also possible.

Figure 5:
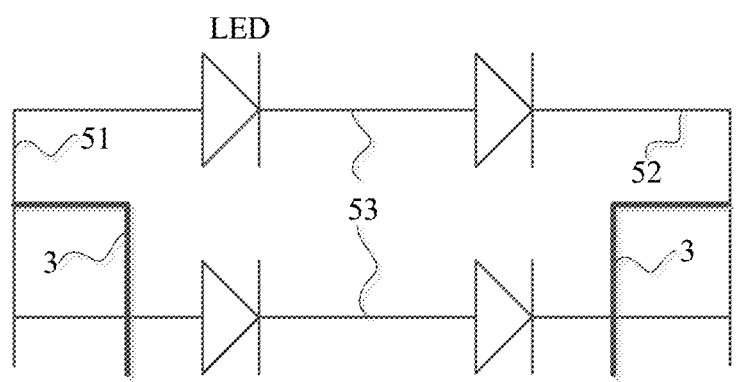
FIG. 5 is an equivalent circuit diagram of part C in FIG. 1.

FIG. 5 is an equivalent circuit diagram of part C in FIG. 1. As shown in FIG. 5, each group of second wirings 5 includes an anode wiring 51, a connecting wiring 53, and a cathode wiring 52, and each group of second wirings 5 connects four LEDs which are connected in a manner that two LEDs are connected in series and two LEDs are connected in parallel, in which the anode wiring 51 is connected to the anode of the LED, the cathode wiring 52 is connected to the cathode of the LED, and the connecting line 53 connects the anode of the LED to the cathode of the adjacent LED.

Because the current load of the driving substrate is large, the resistance performance of the wiring is high, and the conductivity of copper is excellent. Therefore, the first wiring can be made of copper. As shown in FIGS. 2 and 3, the first wiring 3 includes a copper layer 32. The thickness of the copper layer 32 can be adjusted according to the magnitude of the current load. The greater the current load, the greater the thickness of the copper layer 32. The thickness of the copper layer 32 can be in a range from 1 μm to 30 μm. The copper layer 32 can be formed by sputtering, electroplating, electroless plating, etc. The stress buffer layer 2 can be made of one or more insulating materials of SiN, SiO, and SiON, and have a stress direction opposite to that of the formed copper layer 32 so as to offset the stress generated when the copper layer 32 is formed, and to prevent the base substrate 1 from being broken. The greater the thickness of the formed copper layer 32, the greater the stress generated. In order to further reduce the stress generated when the copper layer 32 is formed, a plurality of copper layers having a relatively small thickness can be separately formed several times, a copper layer 32 is composed of a plurality of copper layers having a relatively small thickness, the method of depositing the copper layer several times can effectively reduce the thermal stress of copper.

A compressive stress refers to the stress that resists the object's tendency to compress. A tensile stress is the reaction force to external force that makes the object stretch. The stress direction of the compressive stress is opposite to the stress direction of the tensile stress. As the thickness of the film layer increases, the stress increase. The copper layer 32 exhibits a tensile stress, and the stress buffer layer 2 exhibits a compressive stress.

Taking the stress buffer layer 2 made of SiN as an example, one SiN layer that exhibits compressive stress is first deposited on the base substrate, and then one copper layer that exhibits tensile stress is deposited. Since the stress direction of the buffer layer is opposite to the stress direction of the copper layer and the stress is offset, the warpage of the base substrate can be greatly reduced. Through experimental verification, a copper layer having a thickness of 3 μm is formed on the base substrate by adding a stress buffer layer, and the warpage of the base substrate at this moment is only equivalent to a warpage of the base substrate that a copper layer having a thickness of 1 μm is formed on the base substrate in absence of a stress buffer layer.

In the related art, when a copper layer having a relatively large thickness is deposited on the base substrate, since the base substrate may be broken due to excessive warpage of the base substrate, the present disclosure provides a stress buffer layer 2 on the base substrate, the stress of the stress buffer layer 2 can offset the gravitational force of the copper layer, the warpage of the base substrate can be improved by adjusting the thickness of the stress buffer layer 2, and the thickness of the copper layer that can be deposited is increased while ensuring that the base substrate is not broken.

In some embodiments, as shown in FIGS. 2 and 3, the first wiring 3 further includes a first metal layer 31 located on the surface of the copper layer 32 proximate to the base substrate 1, in which the adhesive force between the first metal layer 31 and the stress buffer layer 2 is greater than the adhesive force between the copper layer 32 and the stress buffer layer 2, so that the adhesive force between the first wiring 3 and the stress buffer layer 2 can be increased by the first metal layer 31, thereby preventing the first wiring 3 from falling from the base substrate 1. Specifically, the first metal layer 31 may be made of at least one of Mo, MoNb, MoTi, MoWu, MoNi, and MoNiTi. The thickness of the first metal layer 31 does not need to be set relatively large, and may be in a range from 5 nm to 50 nm.

Since the surface of the copper layer 32 is easily oxidized after being exposed to air, it affects the conductive performance. As shown in FIGS. 2 and 3, the first wiring 3 further includes a first conductive protective layer 33 located on the surface of the copper layer 32 away from the base substrate 1. The first conductive protective layer 33 may be made of a metal or a transparent conductive material that is not easily oxidized. Specifically, the first conductive protective layer 33 may be made of at least one of Mo, MoNb, MoTi, MoWu, MoNi, and MoNiTi. The first conductive protective layer 33 can protect the copper layer 32 to avoid surface oxidation of the copper layer 32. The thickness of the first conductive protective layer 33 does not need to be set relatively large, and may be in a range from 5 nm to 50 nm.

The first wiring 3 is covered with a second insulating layer 4. The second insulating layer 4 may be made of inorganic insulating materials, such as silicon nitride, silicon oxide, silicon oxynitride, etc., to protect the first wiring 3 from being oxidized in the subsequent high temperature processes, and the thickness of the second insulating layer 4 may be in a range from 50 nm to 300 nm. The second insulating layer 4 may also be made of a thick organic insulating material, such as organic resin, to fill the gap between the first wirings 3, and to provide a flat surface for the subsequent processes, thereby avoiding a large segment difference in the subsequent process. In this way, the LED displacement problem does not occur during LED bonding. At this time, the thickness of the second insulating layer 4 should be greater than or equal to the thickness of the first wiring 3, and can be in a range from 1 μm to 30 μm.

Figure 4:
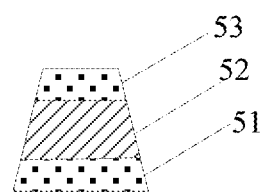
FIG. 4 is a schematic view showing the construction of the second wiring according to an embodiment of the present disclosure.

A second wiring 5 is arranged on the second insulating layer 4. The thickness of the second wiring 5 does not need to be set too large, and may be in a range from 300 nm to 900 nm. Due to its superior electrical conductivity, copper can be used to prepare the second wiring 5. As shown in FIG. 4, the second wiring 5 includes a copper layer 52. The copper layer 52 can be formed by sputtering, electroplating, or electroless plating. In some embodiments, as shown in FIG. 4, the second wiring 5 further includes a second metal layer 51 located on the surface of the copper layer 52 proximate to the base substrate 1, in which the adhesive force between the second metal layer 51 and the second insulating layer 4 is greater than the adhesive force between the copper layer 52 and the second insulating layer 4, so that the adhesive force between the second wiring 5 and the second insulating layer 4 can be increased by the second metal layer 51, thereby preventing the second wiring 5 from falling from the base substrate 1. Specifically, the second metal layer 51 may be made of at least one of Mo, MoNb, MoTi, MoWu, MoNi, and MoNiTi. The thickness of the second metal layer 51 does not need to be set relatively large, and may be in a range from 5 nm to 50 nm.

Since the surface of the copper layer 52 is easily oxidized after being exposed to air, which affects the conductive performance. As shown in FIG. 4, the second wiring 5 further includes a second conductive protective layer 53 located on the surface of the copper layer 52 away from the base substrate 1. The second conductive protective layer 53 may be made of a metal or a transparent conductive material that is not easily oxidized. Specifically, the second conductive protective layer 53 may be made of at least one of Mo, MoNb, MoTi, MoWu, MoNi, and MoNiTi. The second conductive protective layer 53 can protect the copper layer 52 to avoid surface oxidation of the copper layer 52. The thickness of the second conductive protective layer 53 does not need to be set relatively large, and may be in a range from 5 nm to 50 nm.

When the LED is formed on the substrate, the electrode of the LED is electrically connected to the second wiring 5. In the related art, most of the wiring is made of copper, and copper is easily oxidized to form foreign objects such as copper oxide, copper nitride, etc. Thus, the bonding force with the LED through solder is poor, and the LED will show a lot of shedding phenomenon, thereby affecting the brightness and yield of the LED surface light source. In order to increase the adhesive force between the LED solder and the substrate, the driving substrate may further include a NiAu layer located on the surface of the second wiring 5 away from the base substrate 1. The NiAu layer may be formed by electroplating or electroless plating. The addition of a NiAu layer on the second wiring 5 can not only isolate the copper layer 52 and prevent the copper layer 52 from being oxidized by the outside world, but also allows the NiAu layer to form an alloy with the solder, thereby greatly improving the adhesive force between the LED and the substrate and preventing the LED from falling off. After the LED is attached to the substrate through solder, the LED is electrically connected to the second wiring 5 through an alloy 10 composed of NiAu and tin.

Since the NiAu layer can prevent the copper layer 52 from being oxidized by the outside world, when the NiAu layer is formed on the surface of the second wiring 5 away from the base substrate 1, the second conductive protection layer 53 can be omitted.

In some embodiments, the driving substrate further includes a reflective pattern 8 located on the surface of the first insulating layer 6 away from the base substrate 1, and an orthogonal projection of the reflective pattern 8 on the base substrate 1 at least does not partially overlap an orthogonal projection of the LED 7 on the base substrate 1. As shown in FIGS. 2 and 3, the orthogonal projection of the reflective pattern 8 on the base substrate 1 does not overlap the orthogonal projection of the LED 7 on the base substrate 1. Since the light emitted by the LED 7 is directed in various directions, only a part of the light emitted by the LED 7 is emitted toward the light emitting side of the driving substrate, in which the light emitting surface of the driving substrate is the surface of the LED 7 away from the base substrate 1. In order to improve the utilization rate of light, the light emitted from the LED 7 to the reflective pattern 8 can be reflected to the light exiting side by the reflective pattern 8 to improve the light utilization rate of the driving substrate. The reflective pattern 8 can be made of a material having a high reflectivity, and specifically can be made of at least one of: Ag, Al, and Cu. When the material of the reflective pattern 8 is a conductive metal, it is necessary to ensure that the setting of the light emitting pattern 8 does not affect the normal electrical connection between adjacent LEDs 7. Of course, it can be understood that the light emitting pattern 8 may also include a portion arranged on the surface of the LED 7 facing the base substrate 1 to further increase the reflectivity of light.

In some embodiments, as shown in FIGS. 2 and 3, the driving substrate further includes: a transparent insulating pattern 9 located on a surface of the reflective pattern 8 away from the base substrate 1, an orthogonal projection of the transparent insulating pattern 9 on the base substrate 1 coincides with an orthogonal projection of the exposed portion of the reflective pattern 8 on the base substrate 1, and the transparent insulating pattern 9 can protect the reflective pattern 8 to avoid the reflective pattern 8 being scratched.

Figure 6:
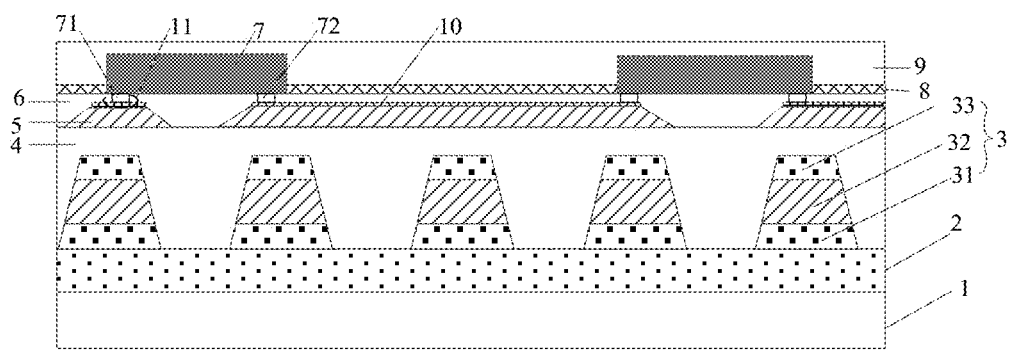
FIG. 6 is a schematic view showing the cross section in the direction of BB of FIG. 1 according to another embodiment of the present disclosure.

When the transmittance of the transparent insulating pattern 9 is good, as shown in FIG. 6, the transparent insulating pattern 9 may cover not only the reflective pattern 8, but also the LED 7, so that the LED 7 can also be protected.

The driving substrate includes a display area and a binding area located around the display area, and the via hole penetrating the second insulating layer includes a first via hole located in the display area and a second via hole located in the binding area. Since the current load of the binding area is greater than the current load of the display area, the diameter of the first via hole is smaller than the diameter of the second via hole, such that the connection resistance between the first wiring and the second wiring of the binding area is relatively small. Specifically, the diameter of the first via hole may be on the order of micrometers, and the diameter of the second via hole may be on the order of millimeters.

An embodiment of the present disclosure further provides a display device including the driving substrate as described above. The display device may be any product or component having a display function, such as a liquid crystal television, a liquid crystal display, a digital photo frame, a mobile phone, a tablet computer, etc., in which the display device further includes a flexible circuit board, a printed circuit board, and a backplane.

When the electronic component of the driving substrate is an LED, the driving substrate can be used as a surface light source of the display device.

An embodiment of the present disclosure further provides a method for preparing a driving substrate, including: providing a base substrate; forming a stress buffer layer on the base substrate; forming at least one conductive layer on the stress buffer layer, a stress direction of the conductive layer being opposite to a stress direction of the stress buffer layer, and forming a wiring structure by using the at least one conductive layer, a thickness of the conductive layer in contact with the stress buffer layer being greater than a threshold; forming a first insulating layer covering the wiring structure; and binding a plurality of electronic components on the first insulating layer, the electronic component being connected to the wiring structure through a via hole penetrating the first insulating layer.

In this embodiment, a stress buffer layer is arranged on the base substrate, and the stress buffer layer can relieve the stress generated when the conductive layer is formed on the base substrate, so that the base substrate will not be broken. In this way, a relatively thick conductive layer may be formed on the base substrate, and the wiring prepared by using the relatively thick conductive layer can meet the resistivity requirements of the driving substrate for the wiring, thereby arranging electronic components on the base substrate to achieve a large-scale driving substrate and to improve the resolution and display effect of the display product. Specifically, the above threshold may be 1 μm.

The base substrate may be a glass substrate or a quartz substrate. The size of the base substrate can reach 3 m×3 m or more, so that the technical solution of the present disclosure can achieve mass production of a large-sized driving substrate. Among them, the electronic component may be an LED, so that the technical solution of the present disclosure can achieve a large-sized LED substrate.

In some embodiments, forming each conductive layer includes: forming a plurality of conductive sub-layers respectively, the conductive layer being formed by stacking the plurality of conductive sub-layers. Since the greater the thickness of the conductive layer formed, the greater the stress generated, in order to further reduce the stress generated during the formation of the conductive layer, a plurality of conductive sublayers having smaller thickness can be separately formed several times. The plurality of conductive sublayers having a smaller thickness is stacked to form a conductive layer, and the number and thickness of the conductive sublayers can be adjusted as needed.

In order to increase the density of electronic components on the driving substrate, the forming the wiring structure includes the steps of sequentially forming a plurality of wiring layers and forming a second insulating layer between adjacent wiring layers, so that in a direction away from the base substrate, each wiring of a current layer is connected to at least one wiring of a next layer, and each wiring of the last layer is connected to at least one electronic component.

In a specific embodiment, the at least one conductive layer includes a first conductive layer and a second conductive layer, and the forming the wiring structure includes: forming a first conductive layer on the stress buffer layer; patterning the first conductive layer to form a first wiring layer, the first wiring layer including a plurality of first wirings that is isolated from each other; forming a second insulating layer covering the first wiring layer; and forming a second conductive layer on the second insulating layer, and patterning the second conductive layer to form a second wiring layer, the second wiring layer including a plurality of second wirings that is insulated from each other, each of the plurality of first wirings being connected to at least one of the plurality of second wirings through a via hole penetrating through the second insulating layer, and each of the plurality of the second wirings being connected to at least one electronic component through a via hole penetrating the first insulating layer.

Of course, the wiring structure is not limited to include two wiring layers, and may also include more wiring layers. The more wiring layers of the wiring structure, the greater the density of electronic components that can be arranged.

In some embodiments, after a conductive layer farthest from the base substrate is formed, the method further includes:

forming a NiAu layer on the farthest conductive layer.

Taking an electronic component being an LED as an example, when the LED is formed on a substrate, the electrode of the LED is electrically connected to a wiring formed of a conductive layer farthest from the base substrate. In the related art, most of the wiring is made of copper, and copper is easily oxidized to form foreign objects such as copper oxide, copper nitride, etc. Thus, the bonding force with the LED through solder is poor, and the LED will show a lot of shedding phenomenon, thereby affecting the brightness and yield of the LED surface light source. In order to increase the adhesive force of LED solder to the substrate, a NiAu layer is formed on the conductive layer farthest from the base substrate. The NiAu layer can be formed by electroplating or electroless plating. The NiAu layer can also form an alloy with the solder, so that when the LED is combined to the substrate by a solder, the solder forms an alloy with the NiAu layer on the conductive layer farthest from the base substrate, thereby being capable of greatly improving the adhesive force of the LED solder to the substrate and preventing the LED from falling off.

Since copper has a good electrical conductivity and can meet the wiring requirements of the driving substrate, copper can be used to prepare the wiring of the driving substrate. Taking the wiring made of copper and the electronic component being LED as an example, the method for preparing the driving substrate in this embodiment specifically includes the following steps.

Step 1. providing a base substrate 1 and forming a stress buffer layer 2 on the base substrate;

The base substrate 1 may be a glass substrate or a quartz substrate. The stress buffer layer 2 may be made of one or more insulating materials of SiN, SiO, and SiON. The stress buffer layer 2 has a stress direction opposite to that of the copper layer 32 to be formed, so that the stress buffer layer 2 can offset the stress generated when the copper layer 32 is formed, and prevent the base substrate 1 from being broken.

Step 2. forming a first metal layer 31 on the stress buffer layer 2;

Since the adhesive force between the copper layer 32 and the stress buffer layer 2 is not too strong, the first metal layer 31 can be formed on the stress buffer layer 2 first, and the adhesive force between the first metal layer 31 and the stress buffer layer 2 is greater than the adhesive force between the copper layer 32 and the stress buffer layer 2, so that the adhesive force between the first wiring 3 and the stress buffer layer 2 can be increased by the first metal layer 31, thereby preventing the first wiring 3 from falling from the base substrate 1. Specifically, the first metal layer 31 may be made of at least one of Mo, MoNb, MoTi, MoWu, MoNi, and MoNiTi. The thickness of the first metal layer 31 does not need to be set relatively large, and may be in a range from 5 nm to 50 nm.

Step 3. forming a copper layer 32 on the first metal layer 31;

The copper layer 32 can be formed by sputtering, electroplating, electroless plating, etc. The thickness of the copper layer 32 can be adjusted according to the magnitude of the current load of the driving substrate, and the thickness of the copper layer 32 can be in a range from 1 μm to 30 μm. The greater the thickness of the formed copper layer 32, the greater the stress generated. In order to further reduce the stress generated when the copper layer 32 is formed, a plurality of copper layers having a relatively small thickness can be separately formed, the copper layer 32 is composed of a plurality of copper layers having a relatively small thickness.

Step 4. forming a first conductive protective layer 33 on the copper layer 32;

Since the surface of the copper layer 32 is easily oxidized after being exposed to air, it affects the conductive performance. A first conductive protective layer 33 is formed on the surface of the copper layer 32 away from the base substrate 1. The first conductive protective layer 33 may be made of a metal or a transparent conductive material that is not easily oxidized. Specifically, the first conductive protective layer 33 may be made of at least one of Mo, MoNb, MoTi, MoWu, MoNi, and MoNiTi. The first conductive protective layer 33 can protect the copper layer 32 to avoid surface oxidation of the copper layer 32. The thickness of the first conductive protective layer 33 does not need to be set relatively large, and may be in a range from 5 nm to 50 nm.

Figure 7:
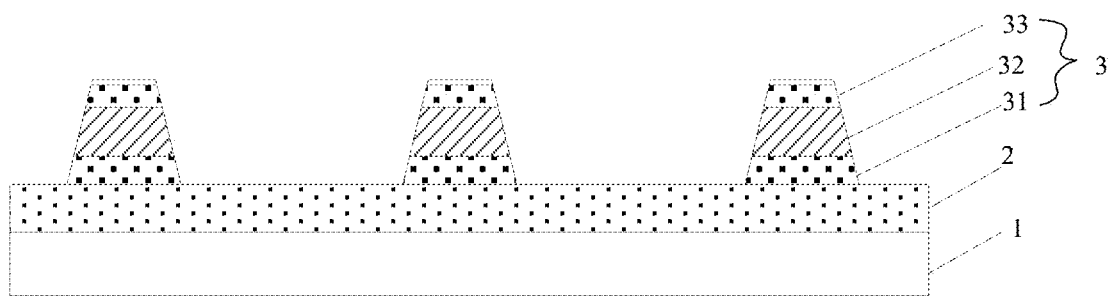
FIG. 7 is a schematic view after the forming the stress buffer layer and the first wiring on the base substrate according to an embodiment of the present disclosure.

Step 5. as shown in FIG. 7, patterning the first metal layer 31, the copper layer 32, and the first conductive protective layer 33 to form the first wiring 3;

After each film layer is formed, the formed film layer may be patterned to form a part of the first wiring 3. In order to simplify the process flow, after the first metal layer 31, the copper layer 32 and the first conductive protective layer 33 are formed, the first metal layer 31, the copper layer 32 and the first conductive protective layer 33 may also be patterned together to form the first wiring 3.

Figure 8:
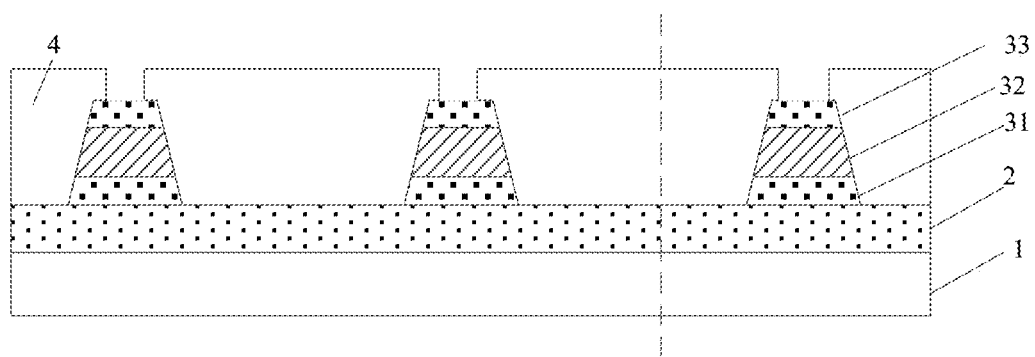
FIG. 8 is a schematic view after the forming the second insulating layer according to an embodiment of the present disclosure.

Step 6. as shown in FIG. 8, forming a second insulating layer 4 covering the first wiring 3, and patterning the second insulating layer 4 to form a via hole exposing the first wiring 3;

The second insulating layer 4 may be made of inorganic insulating materials, such as silicon nitride, silicon oxide, silicon oxynitride, etc., to protect the first wiring 3 from being oxidized in the subsequent high temperature processes, and the thickness of the second insulating layer 4 may be in a range from 50 nm to 300 nm. The second insulating layer 4 may also be made of a thick organic insulating material, such as organic resin, to fill the gap between the first wirings 3, and to provide a flat surface for the subsequent processes, thereby avoiding a large segment difference in the subsequent process. In this way, the LED displacement problem does not occur during LED bonding. At this time, the thickness of the second insulating layer 4 should be greater than or equal to the thickness of the first wiring 3, and can be in a range from 1 μm to 30 μm.

The second insulating layer 4 may be dry etched to form a via hole exposing the first wiring 3. The driving substrate includes a display area and a binding area located around the display area, and the via hole penetrating the second insulating layer 4 includes a first via hole located in the display area and a second via hole located in the binding area. As shown in FIG. 8, the left side of the dotted line is the display area, and the right side of the dotted line is the bonding area. Since the current load of the binding area is greater than the current load of the display area, the diameter of the first via hole located in the display area is smaller than the diameter of the second via hole located in the binding area, such that the connection resistance between the first wiring 3 and the second wiring 5 of the binding area is relatively small. Specifically, the diameter of the first via hole may be on the order of micrometers, and the diameter of the second via hole may be on the order of millimeters.

Figure 9:
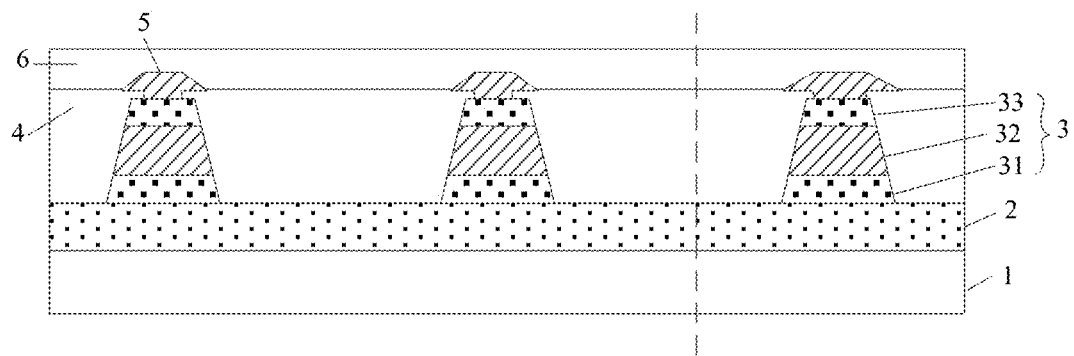
FIG. 9 is a schematic view after the forming the second wiring and the first insulating layer according to an embodiment of the present disclosure.

Step 7. as shown in FIG. 9, forming a second wiring 5;

The thickness of the second wiring 5 does not need to be set too large, and may be in a range from 300 nm to 900 nm. Due to its superior electrical conductivity, copper can be used to prepare the second wiring 5. Of course, other conductive materials can also be used to prepare the second wiring 5.

As shown in FIG. 4, the second wiring 5 includes a copper layer 52. The copper layer 52 can be formed by sputtering, electroplating, or electroless plating. In some embodiments, as shown in FIG. 4, the second wiring 5 further includes a second metal layer 51 located on the surface of the copper layer 52 proximate to the base substrate 1, in which the adhesive force between the second metal layer 51 and the second insulating layer 4 is greater than the adhesive force between the copper layer 52 and the second insulating layer 4, so that the adhesive force between the second wiring 5 and the second insulating layer 4 can be increased by the second metal layer 51, thereby preventing the second wiring 5 from falling off the base substrate 1. Specifically, the second metal layer 51 may be made of at least one of Mo, MoNb, MoTi, MoWu, MoNi, and MoNiTi. The thickness of the second metal layer 51 does not need to be set relatively large, and may be in a range from 5 nm to 50 nm.

Since the surface of the copper layer 52 is easily oxidized after being exposed to air, which affects the conductive performance. As shown in FIG. 4, the second wiring 5 further includes a second conductive protective layer 53 located on the surface of the copper layer 52 away from the base substrate 1. The second conductive protective layer 53 may be made of a metal or a transparent conductive material that is not easily oxidized. Specifically, the second conductive protective layer 53 may be made of at least one of Mo, MoNb, MoTi, MoWu, MoNi, and MoNiTi. The second conductive protective layer 53 can protect the copper layer 52 to avoid surface oxidation of the copper layer 52. The thickness of the second conductive protective layer 53 does not need to be set relatively large, and may be in a range from 5 nm to 50 nm.

After each film layer is formed, the formed film layer may be patterned to form a part of the second wiring 5. In order to simplify the process flow, after the second metal layer 51, the copper layer 52 and the second conductive protective layer 53 are formed, the second metal layer 51, the copper layer 52 and the second conductive protective layer 53 may also be patterned together to form the second wiring 5.

In order to increase the adhesion of the LED solder to the substrate, a NiAu layer can also be formed on the surface of the second wiring 5 away from the base substrate 1. The NiAu layer may be formed by electroplating or electroless plating. The addition of the NiAu layer on the second wiring 5 can not only isolate the copper layer 52 and prevent the copper layer 52 from being oxidized by the outside world, but also allows the NiAu layer to form an alloy with the solder, thereby greatly improving the adhesive force between the LED solder and the substrate and preventing the LED from falling off.

Step 8. as shown in FIG. 3, forming a first insulating layer 6;

The first insulating layer 6 may be made of inorganic insulating materials, such as silicon nitride, silicon oxide, silicon oxynitride, etc., to protect the second wiring 5 from being oxidized in the subsequent high temperature processes, and the thickness of the first insulating layer 6 may be in a range from 50 nm to 300 nm. The first insulating layer 6 may also be made of a thick organic insulating material, such as organic resin, to fill the gap between the second wirings 5, and to provide a flat surface for the subsequent processes, thereby avoiding a large segment difference in the subsequent process. In this way, the LED displacement problem does not occur during LED bonding. At this time, the thickness of the first insulating layer 6 should be greater than or equal to the thickness of the second wiring 5.

Step 9. forming a via hole penetrating the first insulating layer 6;

Specifically, the first insulating layer 6 may be dry etched to form a via hole exposing the second wiring 5.

Step 10. forming a reflective pattern 8 on the first insulating layer 6;

The light emitted by the LED 7 is directed in various directions. In order to improve the utilization rate of light, the light emitted from the LED 7 to the reflective pattern 8 is reflected to the side of the reflective pattern 8 away from the base substrate 1 by the reflective pattern 8 to improve the light utilization rate of the driving substrate. The reflective pattern 8 can be made of a material having a high reflectivity, and specifically can be made of at least one of: Ag, Al, and Cu.

Step 11. forming a transparent insulating pattern 9 on the reflective pattern 8;

An orthogonal projection of the transparent insulating pattern 9 on the base substrate 1 coincides with an orthogonal projection of the exposed portion of the reflective pattern 8 on the base substrate 1, and the transparent insulating pattern 9 can protect the reflective pattern 8 to avoid reflective pattern 8 being scratched.

Step 12. as shown in FIG. 3, binding the LED to the driving substrate.

Specifically, the LED can be bound to the driving substrate by solder, and the solder and the NiAu layer on the second wiring 5 form an alloy 10, which can firmly bind the LED on the driving substrate and prevent the LED 7 from falling off.

After the above steps, the driving substrate of the present embodiment shown in FIG. 3 can be obtained, and mass production of a large-sized driving substrate can be achieved by this embodiment, thereby further improving the resolution and display effect of the display product.

In some embodiments, an orthogonal projection of the transparent insulating pattern 9 on the base substrate 1 coincides with an orthogonal projection of the exposed portion of the reflective pattern 8 on the base substrate 1. The LED binding may be performed after the transparent insulating pattern 9 and the reflective pattern 8 are formed. Therefore, a transparent insulating pattern 9 and the reflective pattern 8 are formed through a patterning process before the LED is bound.

When the transmittance of the transparent insulating pattern 9 is good, a transparent insulating pattern 9 covering the reflective pattern 8 and the LED 7 can be formed after the LED is bound, as shown in FIG. 6, so that the transparent insulating pattern 9 can protect the LED 7. Therefore, before binding the LED, a reflective pattern 8 needs to be formed through a patterning process, and then the LED is bound. After the LED 7 is bound, a transparent insulating material is coated to form a transparent insulating pattern 9.

In the method embodiments of the present disclosure, the serial numbers of the steps cannot be used to define the sequence of the steps. As for one skilled in the art, the changes in the order of steps without paying creative work also fall within the scope of the present disclosure.

Unless otherwise defined, technical terms or scientific terms used herein have the normal meaning commonly understood by one skilled in the art in the field of the present disclosure. The words "first", "second", and the like used herein does not denote any order, quantity, or importance, but rather merely serves to distinguish different components. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

It will be understood that when an element, such as a layer, film, region, or substrate, is referred to as being "on" or "under" another element, the element may be directly "on" or "under" another element, or there may be an intermediate element.

The above descriptions are preferred embodiments of the present disclosure. It should be noted that one skilled in the art would make several improvements and substitutions without departing from the principles of the present disclosure. These improvements and modifications should also be regarded as the protection scope of the present disclosure.

What is claimed is:

1. A driving substrate, comprising:
a base substrate;
a stress buffer layer located on the base substrate;
a wiring structure located on a surface of the stress buffer layer away from the base substrate, a thickness of a wiring in the wiring structure in contact with the stress buffer layer being greater than a threshold;
a first insulating layer located on a surface of the wiring structure away from the base substrate; and
a plurality of electronic components located on a surface of the first insulating layer away from the base substrate, each of the plurality of electronic components being connected to the wiring structure through a via hole penetrating the first insulating layer,
wherein the wiring structure comprises at least two wiring layers, each wiring layer comprises a plurality of wirings, and a second insulating layer is located between adjacent wiring layers, so that in a direction away from the base substrate, each wiring of a current layer is connected to at least one wiring of a next layer, and each wiring of the last layer is connected to at least one electronic component, wherein the wiring structure comprises a first wiring layer and a second wiring layer, the first wiring layer comprises a plurality of first wirings that is insulated from each other, the second wiring layer comprises a plurality of second wirings that is insulated from each other, each of the plurality of first wirings is connected to at least one of the plurality of second wirings through a via hole penetrating through the second insulating layer, and each of the plurality of second wirings is connected to at least one electronic component through the via hole penetrating the first insulating layer, and wherein the second wiring layer comprises a plurality of groups of second wirings that are arranged in an array, and the plurality of groups of second wirings is distributed substantially along a square ring shape.

2. The driving substrate of claim 1, wherein the stress buffer layer is made of at least one of SiN, SiO, or SiON.

3. The driving substrate of claim 1, wherein the driving substrate further comprises: an alloy composed of NiAu and Sn located on a surface of the second wiring away from the base substrate, and the electronic component is connected to the second wiring through the alloy.

4. The driving substrate of claim 1, wherein the driving substrate further comprises: a reflective pattern located on the surface of the first insulating layer away from the base substrate, and an orthogonal projection of the reflective pattern on the base substrate at least does not partially overlap an orthogonal projection of the electronic component on the base substrate.

5. The driving substrate of claim 1, wherein the base substrate is a glass substrate or a quartz substrate.

6. The driving substrate of claim 1, wherein the electronic component is an LED.

7. The driving substrate of claim 1, wherein the driving substrate comprises a display area and a binding area located around the display area, the via hole penetrating the second insulating layer comprises a first via hole located in the display area and a second via hole located in the binding area, and a diameter of the first via hole is less than a diameter of the second via hole.

8. The driving substrate of claim 1, wherein the threshold value is 1 μm.

9. A display device, comprising the driving substrate of claim 1.

10. A method for preparing a driving substrate of claim 1 comprising:

providing a base substrate;
forming a stress buffer layer on the base substrate;
forming at least one conductive layer on the stress buffer layer, a stress direction of the conductive layer being opposite to a stress direction of the stress buffer layer, and forming a wiring structure by using the at least one conductive layer, a thickness of the conductive layer in contact with the stress buffer layer being greater than a threshold;

forming a first insulating layer covering the wiring structure; and binding a plurality of electronic components on the first insulating layer, the electronic component being connected to the wiring structure through a via hole penetrating the first insulating layer.

11. The method of claim 10, wherein the threshold value is 1 μm.

12. The method of claim 10, wherein the forming at least one conductive layer comprises: forming a plurality of conductive sub-layers, the conductive layer being formed by stacking the plurality of conductive sub-layers.

13. The method of claim 10, wherein the first wiring and the second wiring comprise a copper layer.

14. The driving substrate of claim 1, wherein the first wiring and the second wiring comprise a copper layer.

15. The driving substrate of claim 14, wherein the first wiring further comprises a first metal layer located on a surface of the copper layer proximate to the base substrate, and an adhesive force between the first metal layer and the stress buffer layer is greater than an adhesive force between the copper layer and the stress buffer layer; and the second wiring further comprises a second metal layer located on a surface of the copper layer proximate to the base substrate, and an adhesion between the second metal layer and the second insulating layer is greater than an adhesion between the copper layer and the second insulating layer.

16. The driving substrate of claim 15, wherein the first metal layer and the second metal layer are made of at least one of Mo, MoNb, MoTi, MoWu, MoNi, or MoNiTi.

17. The driving substrate of claim 16, wherein a thickness of the first metal layer is in a range from 5 nm to 50 nm, a thickness of the second metal layer is in a range from 5 nm to 50 nm, and a thickness of the copper layer is in a range from 1 μm to 30 μm.

18. The driving substrate of claim 15, wherein the first wiring further comprises a first conductive protective layer located on a surface of the copper layer away from the base substrate; and the second wiring further comprises a second conductive protection layer located on a surface of the copper layer away from the base substrate.

19. The driving substrate of claim 18, wherein the first conductive protection layer and the second conductive protection layer are made of at least one of Mo, MoNb, MoTi, MoWu, MoNi, or MoNiTi.

20. The driving substrate of claim 19, wherein a thickness of the first conductive protective layer is in a range from 5 nm to 50 nm, and a thickness of the second conductive protective layer is in a range from 5 nm to 50 nm.

* * * * *